(12) United States Patent
Fleischhaker et al.

(10) Patent No.: US 9,263,591 B2
(45) Date of Patent: Feb. 16, 2016

(54) METAL OXIDE FIELD EFFECT TRANSISTORS ON A MECHANICALLY FLEXIBLE POLYMER SUBSTRATE HAVING A DIE-LECTRIC THAT CAN BE PROCESSED FROM SOLUTION AT LOW TEMPERATURES

(75) Inventors: Friederike Fleischhaker, Ludwigshafen (DE); Veronika Wloka, Mannheim (DE); Thomas Kaiser, Haßloch (DE)

(73) Assignee: BASF SE, Ludwigshafen (DE)

( * ) Notice: Subject to any disclaimer, the term of this patent is extended or adjusted under 35 U.S.C. 154(b) by 46 days.

(21) Appl. No.: 13/515,303

(22) PCT Filed: Dec. 3, 2010

(86) PCT No.: PCT/EP2010/068867
§ 371 (c)(1),
(2), (4) Date: Jul. 23, 2012

(87) PCT Pub. No.: WO2011/073044
PCT Pub. Date: Jun. 23, 2011

(65) Prior Publication Data
US 2012/0280228 A1    Nov. 8, 2012

(30) Foreign Application Priority Data
Dec. 18, 2009   (EP) ..................................... 09179923

(51) Int. Cl.
*H01L 29/786* (2006.01)
*H01L 29/49* (2006.01)
*H01L 27/12* (2006.01)

(52) U.S. Cl.
CPC ........ *H01L 29/7869* (2013.01); *H01L 29/4908* (2013.01); *H01L 29/78603* (2013.01); *H01L 27/1292* (2013.01)

(58) Field of Classification Search
CPC ..................... H01L 29/78603; H01L 29/4908; H01L 27/1214; H01L 51/5237; H01L 29/78696; H01L 51/003; H01L 29/7869; H01L 29/78693

USPC ....................................... 257/43; 438/104, 149
See application file for complete search history.

(56) References Cited

U.S. PATENT DOCUMENTS 5,198,673 A *   3/1993   Rougeot ........... H01L 27/14663
                                                          250/370.09
6,322,860 B1 *  11/2001  Stein et al. .................... 428/1.26
(Continued)

FOREIGN PATENT DOCUMENTS

| EP | 2236543 A1 | 10/2010 |
|---|---|---|
| WO | 2005093848 A1 | 10/2005 |
| WO | 2009075233 A1 | 6/2009 |

OTHER PUBLICATIONS

Kwon et al. J. Phys. D: Appl. Phys. Bd. 42, 2009 p. 065105.
(Continued)

*Primary Examiner* — Anthony Ho
*Assistant Examiner* — Samuel Lair
(74) *Attorney, Agent, or Firm* — Shruti Costales

(57) ABSTRACT

The present invention relates to a method for producing an electronic component, in particular a field-effect transistor (FET), comprising at least one substrate, at least one dielectric, and at least one semiconducting metal oxide, wherein the dielectric or a precursor compound thereof based on organically modified silicon oxide compounds, in particular based on silsequioxanes and/or siloxanes, can be processed out of solution, and is thermally treated at a low temperature from room temperature to 350° C., and the semiconductive metal oxide, in particular ZnO or a precursor compound thereof, can also be processed from solution at a low temperature from room temperature to 350° C.

17 Claims, 2 Drawing Sheets

(56) References Cited

U.S. PATENT DOCUMENTS

Figure 1:
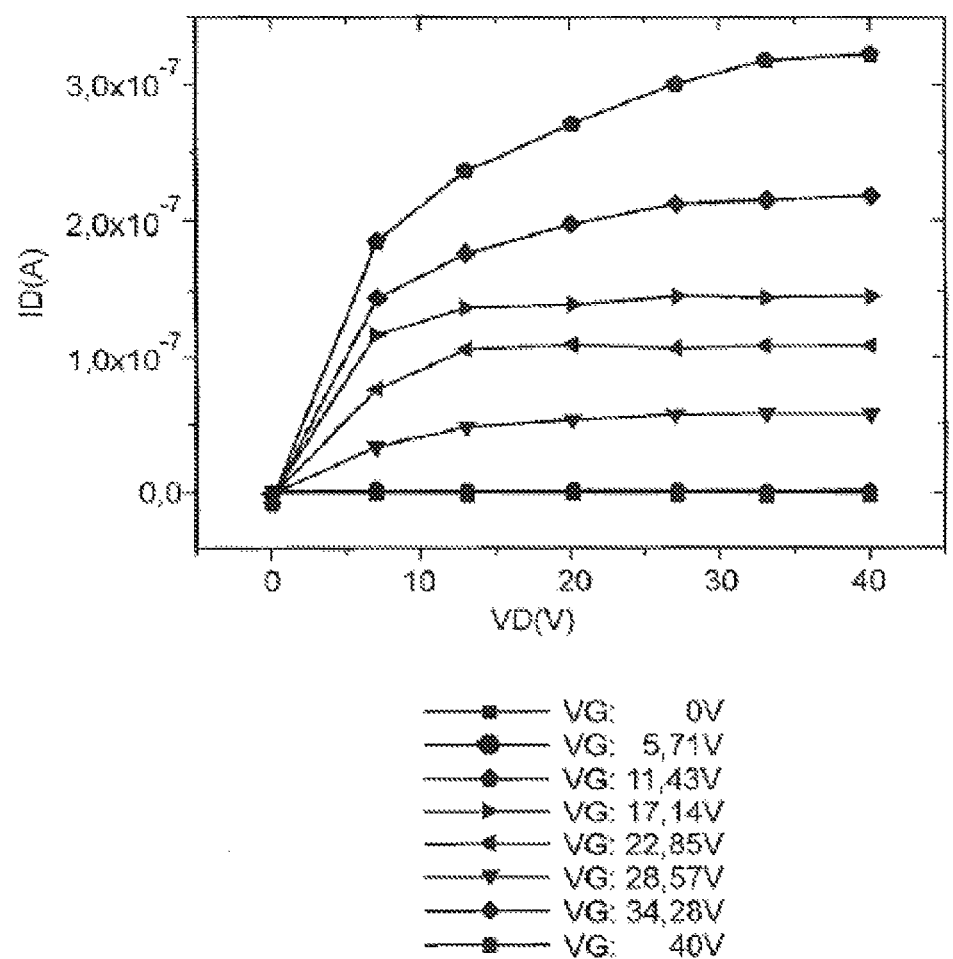

| | | |
|---|---|---|
| 6,891,237 B1 | 5/2005 | Bao |
| 2002/0006689 A1* | 1/2002 | Miyasaka ........... C23C 16/0209 438/149 |
| 2005/0148129 A1 | 7/2005 | Bao |
| 2006/0094168 A1* | 5/2006 | Hoffman et al. ............... 438/149 |
| 2007/0072439 A1* | 3/2007 | Akimoto et al. .............. 438/795 |
| 2007/0087564 A1* | 4/2007 | Speakman .................... 438/674 |
| 2008/0017854 A1* | 1/2008 | Marks et al. .................... 257/43 |
| 2008/0246095 A1* | 10/2008 | Wu et al. ........................ 257/401 |
| 2009/0002590 A1* | 1/2009 | Kimura .............. H01L 27/1214 349/43 |
| 2009/0050876 A1* | 2/2009 | Marks et al. .................... 257/24 |
| 2009/0315457 A1* | 12/2009 | Furukawa et al. ............. 313/504 |
| 2010/0025677 A1* | 2/2010 | Yamazaki et al. ................ 257/43 |
| 2010/0038638 A1* | 2/2010 | Tao et al. ......................... 257/43 |
| 2011/0001190 A1 | 1/2011 | Ide et al. |
| 2011/0163278 A1 | 7/2011 | Domke |
| 2012/0043537 A1 | 2/2012 | Karpov |
| 2012/0086002 A1 | 4/2012 | Fleischhaker |
| 2012/0328509 A1* | 12/2012 | Wloka et al. .................. 423/622 |

OTHER PUBLICATIONS

Salim et al. Thin Solid Films Bd. 518, 2009, pp. 362-365.
S. Meiers et al. J. Am. Soc. Bd. 130, Nr. 51, 2008, pp. 17603-17609.

* cited by examiner

METAL OXIDE FIELD EFFECT TRANSISTORS ON A MECHANICALLY FLEXIBLE POLYMER SUBSTRATE HAVING A DIE-LECTRIC THAT CAN BE PROCESSED FROM SOLUTION AT LOW TEMPERATURES

The present invention relates to a process for producing an electronic component, especially a field-effect transistor (FET), comprising at least one substrate, at least one dielectric and at least one semiconductive metal oxide, wherein the dielectric or a precursor compound thereof based on organically modified silica compounds, especially based on silsesquioxanes and/or siloxanes, is processible from solution and is treated thermally at a low temperature from room temperature to 350° C., and the semiconductive metal oxide, especially ZnO, or a precursor compound thereof, can likewise be processed from solution and at low temperatures from room temperature to 350° C. Furthermore, the present invention relates to a corresponding electronic component, and to the use of organically modified silica compounds for the preparation of electronic components.

Processes for producing electronic components, especially field-effect transistors (FETs), are already known from the prior art.

US 2005/0148129 A1 discloses a process for producing an organic semiconductive component with an active dielectric layer comprising silsesquioxanes. For this purpose, a dielectric film is obtained by applying silsesquioxane precursor compounds in solution to an appropriate substrate. However, the document cited does not disclose the combination of silsesquioxanes as a dielectric, which are applied from solution, in conjunction with inorganic semiconductive materials, especially metal oxides, since the document cited discloses only organic semiconductive materials.

U.S. Pat. No. 6,891,237 B1 discloses organic semiconductor components with an active dielectric layer originating from silsesquioxanes. However, this document discloses merely the combination of a dielectric layer composed of optionally silane-treated silsesquioxanes with organic semiconductive materials, for example copper hexadecafluorophthalocyanines, α-sexithiophene, dihexyl-α-pentathiophene and pentacene, but not the combination of these dielectrics with inorganic semiconductive materials.

Kwon et al., J. Phys. D: Appl. Phys. 42 (2009), 065105 disclose a thin-film transistor comprising a zinc oxide applied by RF sputtering as a semiconductor material, and also a methylsiloxane-based dielectric which is obtained by spin-coating and subsequent thermal treatment at 450° C.

Salim et al., Thin solid films 518 (2009), 362 to 365, discloses ZnO as a dielectric for optically transparent non-volatile storage materials. The main storage element is a triple layer structure consisting of a thin ZnO film enclosed between two layers of methylsilsesquioxane. The ZnO film is likewise applied by a sputtering technique; the methylsilsesquioxane is treated thermally at a temperature of 400° C.

It is thus an object of the present invention, with respect to the prior art cited, to provide a process for producing electronic components, especially FETs (field-effect transistors), which is notable for a particularly simple, inexpensive and extensive process regime. This includes, more particularly, the option of processibility of dielectric and semiconductor material from solution, which, for example, enables the use of printing techniques, and also the use of mostly nontoxic, oxidation-insensitive metal oxides which are extremely simple and inexpensive to synthesize and are optically transparent, especially ZnO, instead of organic materials as the semiconductor material, especially as the n-semiconductor material. In addition, the invention is notable for a selection and combination of dielectric and semiconductor material which are particularly suitable for the operability of electronic components, especially FETs. In addition, the low process temperature should ensure that even heat-sensitive substrates, for example polymer films, can be correspondingly coated. This should provide access to electronic components based on flexible substrates.

These objects are achieved in accordance with the invention by a process for producing an electronic component comprising at least one substrate, at least one dielectric and at least one semiconductive metal oxide, comprising the steps of:

(A) singly or repeatedly applying a solution comprising at least one dielectric or precursor compound thereof based on organically modified silica compounds,
or
singly or repeatedly applying a solution or dispersion comprising at least one semiconductive metal oxide or a precursor compound thereof to a substrate in order to obtain a substrate coated with a corresponding solution or dispersion, (B) thermally treating the coated substrate from step (A) at a temperature from room temperature to 350° C., in order to obtain a substrate coated with the dielectric or the semiconductive metal oxide, (C) if a solution comprising at least one dielectric or a precursor compound thereof based on organically modified silica compounds has been applied in step (A), singly or repeatedly applying a solution or dispersion comprising at least one semiconductive metal oxide or a precursor compound thereof to the substrate from step (B),
or
if a solution or dispersion comprising at least one semiconductive metal oxide or a precursor compound has been applied in step (A), singly or repeatedly applying a solution comprising at least one dielectric or a precursor compound thereof based on organically modified silica compounds to the substrate from step (B), in order to obtain a substrate coated with a corresponding solution or dispersion, and (D) thermally treating the coated substrate from step (C) at a temperature from room temperature to 350° C., in order to obtain a substrate coated with the dielectric and the semiconductive metal oxide.

The individual steps of the process according to the invention are described in detail hereinafter:

Step (A):

Step (A) of the process according to the invention comprises the single or repeated application of a solution comprising at least one dielectric or a precursor compound thereof based on organically modified silica compounds,
or
single or repeated application of a solution or dispersion comprising at least one semiconductive metal oxide or a precursor compound thereof to a substrate, in order to obtain a substrate coated with a corresponding solution or dispersion.

In step (A) of the process according to the invention, in one embodiment (first embodiment), it is possible first to apply a solution comprising at least one dielectric or a precursor compound thereof based on organically modified silica compounds, or in a further embodiment (second embodiment) a solution or dispersion comprising at least one semiconductive metal oxide or a precursor compound thereof, to a substrate, in order to obtain a substrate coated with a corresponding solution or dispersion.

The two embodiments can be selected by the person skilled in the art according to the geometry that the electronic component to be produced is to have. The substrate which is coated in step (A) may additionally already have one or more layers, for example gate, source and/or drain electrodes. The process according to the invention makes all conceivable geometries obtainable, especially the following:

1: Substrate, dielectric, semiconductor, preferably substrate, gate, dielectric, semiconductor, source and drain, known to the person skilled in the art as bottom gate top contact
2: Substrate, dielectric, semiconductor, preferably substrate, gate, dielectric, source and drain, semiconductor, known to the person skilled in the art as bottom gate bottom contact
3: Substrate, semiconductor, dielectric, preferably substrate, source and drain, semiconductor, dielectric, gate, known to the person skilled in the art as top gate bottom contact
4: Substrate, semiconductor, dielectric, preferably substrate, semiconductor, source and drain, dielectric, gate, known to the person skilled in the art as top gate top contact The substrate is preferably always coated with the individual layers from the same side of the substrate, i.e. the individual layers are deposited successively and one on top of another on the substrate. The individual layers may optionally be structured.

It is an essential feature of the process according to the invention that a dielectric or a precursor compound thereof based on organically modified silica compounds, especially based on silsesquioxanes and/or siloxanes, is applied in solution. Silsesquioxanes and siloxanes are used here in the form of oligo- or polysilsesquioxanes or oligo- or polysiloxanes, and are known per se to those skilled in the art.

In a preferred embodiment of the process according to the invention, the organically modified silica compound comprises at least one unit selected from the units of the general formulae (I) to (V), where single oxygen bridges are present between the silicon atoms:

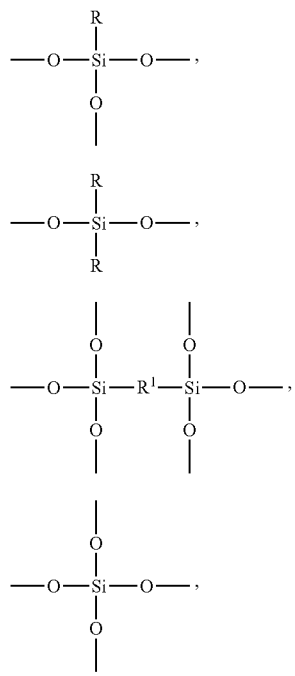

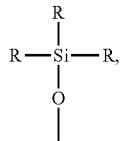

where R and $R^1$ may each be defined as follows:

R is independently hydrogen, linear or branched, substituted or unsubstituted $C_1$-$C_{20}$-alkyl optionally interrupted by at least one heteroatom, at least partly halogenated, linear or branched, substituted or unsubstituted $C_1$-$C_{20}$-alkyl optionally interrupted by at least one heteroatom, substituted or unsubstituted $C_3$-$C_{20}$-cycloalkyl optionally attached via a linear or branched $C_1$-$C_{20}$-alkyl chain, linear or branched, substituted or unsubstituted, at least monounsaturated $C_2$-$C_{20}$-alkenyl optionally interrupted by at least one heteroatom, linear or branched, substituted or unsubstituted, at least monounsaturated $C_2$-$C_{20}$-alkynyl optionally interrupted by at least one heteroatom, substituted or unsubstituted $C_5$-$C_{30}$-aryl optionally attached via a linear or branched $C_1$-$C_{20}$-alkyl chain, $R^1$ is a linear or branched $C_1$-$C_{20}$-alkylidene, -alkenylidene or -alkynylidene group, for example a $C_1$-, $C_2$- or $C_3$-alkyl chain, which may optionally be interrupted by functional groups such as aromatics or heteroaromatics or heteroatoms such as O, S, P or N, or substituted or unsubstituted $C_5$-$C_{30}$-arylene.

A dielectric particularly preferred in accordance with the invention comprises oligo- or polysilsesquioxanes, i.e. compounds which comprise units of the general formula (I)

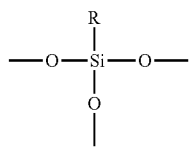

where single oxygen bridges are present between the silicon atoms and where R may be defined as follows:

R is independently hydrogen, linear or branched, substituted or unsubstituted $C_1$-$C_{20}$-alkyl optionally interrupted by at least one heteroatom, at least partly halogenated, linear or branched, substituted or unsubstituted $C_1$-$C_{20}$-alkyl optionally interrupted by at least one heteroatom, substituted or unsubstituted $C_3$-$C_{20}$-cycloalkyl optionally attached via a linear or branched $C_1$-$C_{20}$-alkyl chain, linear or branched, substituted or unsubstituted, at least monounsaturated $C_2$-$C_{20}$-alkenyl optionally interrupted by at least one heteroatom, linear or branched, substituted or unsubstituted, at least monounsaturated $C_2$-$C_{20}$-alkynyl optionally interrupted by at least one heteroatom, substituted or unsubstituted $C_5$-$C_{30}$-aryl attached either directly or via a linear or branched $C_1$-$C_{20}$-alkyl chain.

Heteroatoms usable in accordance with the invention are selected from N, O, P and S.

Preferably in accordance with the invention, R is linear or branched, substituted or unsubstituted $C_1$-$C_{20}$-alkyl, more preferably $C_1$-$C_{12}$-alkyl, most preferably $C_1$-$C_6$-alkyl, for example methyl, ethyl, propyl such as n-propyl, isopropyl, butyl such as n-butyl, iso-butyl, tert-butyl, pentyl such as n-pentyl, isopentyl, tert-pentyl, or hexyl, substituted or unsubstituted $C_5$-$C_{30}$-aryl attached directly or via a linear or branched $C_1$-$C_{20}$-alkyl chain, most preferably phenyl. According to the invention, R is more preferably methyl or phenyl.

In a further preferred embodiment, R is at least partly halogenated, linear or branched, substituted or unsubstituted $C_1$-$C_{20}$-alkyl, more preferably $C_1$-$C_{12}$-alkyl, most preferably $C_1$-$C_6$-alkyl. The radicals mentioned for the alkyl radicals serve as the base structure for this embodiment. This base structure is at least partly halogenated, for example fluorinated, chlorinated, brominated and/or iodinated, preferably fluorinated. Very particularly preferred R radicals in this embodiment are —$CH_2$—$CH_2$—$CF_3$ and —$CF_3$.

In a further embodiment, R is substituted or unsubstituted $C_3$-$C_{20}$-cycloalkyl optionally attached via a linear or branched $C_1$-$C_{20}$-alkyl chain, preferably $C_1$-$C_{12}$-alkyl chain, for example a $C_1$-, $C_2$- or $C_3$-alkyl chain, preferably $C_3$-$C_{10}$-cycloalkyl, more preferably $C_3$-$C_6$-cycloalkyl, for example cyclopentyl, cyclohexyl.

In a preferred embodiment, R is substituted or unsubstituted $C_5$-$C_{30}$-aryl attached either directly or via a linear or branched $C_1$-$C_{20}$-alkyl chain, for example a $C_1$-, $C_2$- or $C_3$-alkyl chain, more preferably $C_5$-$C_{10}$-aryl, most preferably $C_6$-aryl, for example phenyl.

An inventive aryl radical R attached via an alkyl chain is, for example, benzyl.

The aryls usable in accordance with the invention may optionally be substituted, for example by abovementioned alkyl, alkenyl or alkynyl chains, halogens such as fluorine, chlorine, bromine, iodine and/or functional groups, for example as specified above. The aryl radicals preferably do not have any substituents.

According to the invention, R is more preferably phenyl.

In a further preferred embodiment of the present invention, the dielectric used in accordance with the invention comprises, in addition to units of the general formula (I), units of the general formulae (II) to (V), where single oxygen bridges are present between the silicon atoms.

In a further preferred embodiment, the dielectric comprises all conceivable combinations of the units (I), (II), (III), (IV) and (V), though not all units need be present, and single oxygen bridges are likewise present between the silicon atoms.

According to the invention, the units (I), (II), (III), (IV) and/or (V) are joined to one another so as to form linear or branched oligomers or polymers. It is also possible in accordance with the invention that the units (I), (II), (III), (IV) and/or (V) are joined to form cyclic compounds. Examples of cyclic compounds suitable in accordance with the invention are decamethyl cyclopentasiloxane or hexamethyl cyclotrisiloxane.

In the units of the general formulae (II), (V), R may independently be as defined in the general formula (I). R in the general formulae (II), (V) is more preferably methyl or phenyl.

Units of the general formula (III) are generally referred to as bis(silylalkanes). In these bis(silylalkane) units of the general formula (III), $R^1$ is generally independently a linear or branched $C_1$-$C_{20}$-alkylidene, -alkenylidene or -alkynylidene group, for example a $C_1$-, $C_2$- or $C_3$-alkylidene group, which may optionally be interrupted by functional groups such as aromatics or heteroaromatics or heteroatoms such as O, S, P or N, or substituted or unsubstituted $C_5$-$C_{30}$-arylene. $R^1$ in the general formula (III) is preferably —$CH_2$—$CH_2$— or —$CH_2$—.

Units of the formula (IV) can be prepared, for example, proceeding from $SiX_4$ where X is independently halogen, for example chlorine or bromine, or $OR^2$ where $R^2$ is $C_1$-$C_6$-alkyl, for example methyl, ethyl, propyl.

It is also possible to use mixtures of polymers or oligomers comprising units of the general formula (I), (II), (III), (IV), (V), though not all units need be present, and single oxygen bridges are present between the silicon atoms.

In the preferred embodiment of the process according to the invention, the dielectric used is a homopolymer or -oligomer or a block copolymer or oligomer comprising exclusively units of the general formula (I) with single oxygen bridges between the silicon atoms and with R defined as specified.

In a further preferred embodiment of the process according to the invention, the dielectric used is an oligomer or polymer comprising units of the formulae (II) and (III) with single oxygen bridges between the silicon atoms and with R defined as specified. In a further preferred embodiment of the process according to the invention, the dielectric used is an oligomer or polymer comprising units of the formulae (I), (II) and (III) with single oxygen bridges between the silicon atoms and with R defined as specified.

A chain length preferred in accordance with the invention for oligomers is between 10 and 30 units.

A chain length preferred in accordance with the invention for polymers is >30 units.

Suitable precursor compounds of the units (I), (II), (III), (V) mentioned are compounds which can be converted, for example by polycondensation with elimination of small molecules such as water, ethanol or halogen acids such as HCl or HBr, to corresponding oligomers and polymers of the precursor compounds used for the units. Examples of suitable precursor compounds are:

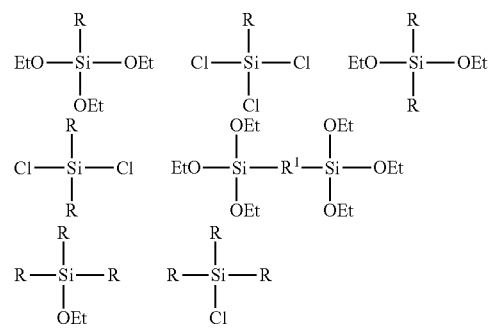

In one embodiment, step (A) of the process according to the invention comprises the single or repeated application of a solution comprising at least one dielectric or a precursor compound thereof based on organically modified silica compounds to a substrate, in order to obtain a substrate coated with this solution.

According to the invention, "singly or repeatedly" means that the step stated can be performed once or more than once, either without subsequent thermal treatment or with subsequent thermal treatment. Preference is given to applying a solution or dispersion once in steps (A) and/or (C).

According to the invention, suitable solvents in this embodiment in step (A) are all of those capable of very substantially dissolving the organically modified silica compounds, especially based on silsesquioxanes and/or siloxanes.

In a preferred embodiment of the process according to the invention, the solvent in step (A) is selected from the group consisting of water, alcohols, for example methanol, ethanol, propanol such as n-propanol, isopropanol, n-butanol, methoxypropanol, esters, for example ethyl acetate, ethyl lactate, carboxylic acids, for example formic acid, acetic acid, amides, amines, ethers, for example diethyl ether, methyl tert-butyl ether, propylene glycol monomethyl ether, aldehydes, ketones, for example acetone, methyl pentyl ketone, cyclohexanone, aromatics, for example toluene, and mixtures thereof.

According to the invention, the concentration of this solution is selected such that it is processible efficiently in accordance with the invention, for example 1 to 60% by weight of organically modified silica compound(s), preferably 10 to 40% by weight, more preferably 20 to 30% by weight, based in each case on the overall solution. The solution is generally prepared by processes known to those skilled in the art, for example introduction of the dielectric or of the precursor thereof into the solvent.

In this embodiment of step (A) of the process according to the invention, the solution comprising a dielectric or a precursor compound thereof based on organically modified silica compounds, especially based on silsesquioxanes and/or siloxanes, is applied to the substrate in an amount sufficient to obtain a sufficiently thick dielectric layer after step (B). A corresponding dielectric layer generally has a thickness of 100 nm to 2 µm, preferably 200 to 800 nm.

In a second embodiment, step (A) of the process according to the invention comprises single or repeated application of a solution or dispersion comprising at least one semiconductive metal oxide or a precursor compound thereof to a substrate, in order to obtain a substrate coated with a corresponding solution or dispersion.

The semiconductive metal oxides usable in the process according to the invention are generally all metal oxides known to be suitable to the person skilled in the art, preferably selected from zinc oxide (ZnO), indium oxide, gallium oxide, tin oxide, aluminum oxide, cadmium oxide and mixed oxides, and also doped metal oxides and mixed oxides thereof, very particular preference being given to ZnO and doped ZnO, doped, for example, with Al, Ga, In and/or Sn.

The present invention therefore also relates to the process according to the invention wherein the at least one semiconductive metal oxide is ZnO.

In one embodiment of the process according to the invention, the semiconductive metal oxide, especially ZnO, is used in the form of the metal oxide in dispersion or as a precursor compound.

The present invention therefore preferably relates to the process according to the invention wherein the semiconductive metal oxide is used in step (A) or (C) in the form of the metal oxide in dispersion or as a precursor compound.

Examples of ZnO in dispersible form are spheres, rods, optionally with ligands, for example alkylamines, hydroxyalkylamines, monoethyl 3-oxoglutarate, thiols, methoxyethanol and the like. This ZnO is dispersed in a suitable dispersant by processes known to those skilled in the art. The amount of dispersed ZnO in the dispersion is generally between 0.01 and 30% by weight, preferably 0.1 to 10% by weight and more preferably between 1 and 5% by weight, based in each case on the dispersion.

In this second embodiment of step (A), preference is given to using a suitable precursor compound of the semiconductive metal oxide in solution.

Suitable precursor compounds of the semiconductive metal oxide are, for example, selected from the group consisting of carboxylates of mono-, di- or polycarboxylic acids or derivatives of mono-, di- or polycarboxylic acids, alkoxides, hydroxides, semicarbazides, carbamates, hydroxamates, isocyanates, amidines, amidrazones, urea derivatives, hydroxylamines, oximes, urethanes, ammonia complexes, amines, phosphines, ammonium compounds, azides, of the corresponding metal and mixtures thereof.

The present invention therefore relates more particularly to the process according to the invention wherein the precursor compounds of the semiconductive metal oxide are selected from the group consisting of carboxylates of mono-, di- or polycarboxylic acids or derivatives of mono-, di- or polycarboxylic acids, alkoxides, hydroxides, semicarbazides, carbamates, hydroxamates, isocyanates, amidines, amidrazones, urea derivatives, hydroxylamines, oximes, urethanes, ammonia complexes, amines, phosphines, ammonium compounds, azides, of the corresponding metal and mixtures thereof.

Further suitable precursor compounds for the ZnO particularly preferred in accordance with the invention are combinations of zinc salts with complexing reagents, for example zinc nitrate, zinc chloride, zinc sulfate, zinc acetate as zinc salts, and organic amines, alcohols and/or carboxylic acids as complexing reagents. Particular preference is given to:
  zinc acetate with 2-ethanolamine in methoxyethanol or ethanol,
  zinc nitrate with ethylenediamine,
  zinc nitrate with hexamethylenediamine,
  zinc complexes with (2-alkoxyimino)alkanoate.

The solvent used for the solution of the precursor compound of the semiconductive metal oxide used may generally be any solvent in which the precursor compounds used are soluble to an extent of at least 0.01% by weight, based on the overall solution.

Suitable solvents are, for example, selected from the group consisting of water, alcohol, for example methanol, ethanol, isopropanol, n-propanol, n-butanol, iso-butanol, tert-butanol, methoxyethanol, ketones, for example acetone, ethers, for example diethyl ether, methyl tert-butyl ether, tetrahydrofuran, dioxane, dimethoxyethane, esters, aromatics, for example toluene, xylenes and mixtures thereof. In this embodiment of step (A) of the process according to the invention, preference is given to using aqueous, alcoholic or ethereal solutions, particular preference to using water, as the solvent.

When a dispersion is used in this embodiment of step (A), the substances mentioned as solvents can be used as dispersants.

The present invention therefore relates more particularly to the process according to the invention wherein the solvent or dispersant for the solution or dispersion comprising at least one semiconductive metal oxide or a precursor compound thereof is selected from the group consisting of alcohols, water, esters, carboxylic acids, amines, amides, ethers, aldehydes, ketones, aromatics and mixtures thereof.

The solution used with preference in this embodiment of step (A) comprises the at least one precursor compound of the at least one semiconductive metal oxide in a concentration of generally 0.01 to 20% by weight, preferably 0.1 to 10% by weight, more preferably 0.5 to 5% by weight, based in each case on the overall solution.

In this second embodiment of step (A) of the process according to the invention, preference is given to using precursor compounds of the semiconductive metal oxide which can be converted to the semiconductive metal oxide at a temperature of generally room temperature to 350° C., preferably 100 to 350° C., more preferably 100 to 250° C., even more preferably 100 to 170° C., especially 140 to 160° C., for example at 150° C.

Carboxylates of the corresponding metal used with preference as the precursor compound of the semiconductive metal oxide are, for example, compounds of the corresponding metal with mono-, di- or polycarboxylic acids or derivatives of mono-, di- or polycarboxylic acids. According to the invention, derivatives of mono-, di- or polycarboxylic acids are understood to mean the corresponding mono-, di- or polyesters, or anhydrides or amides. According to the invention, the metal atom present as the central atom in the carboxylate complexes may generally have coordination numbers of 3 to 6.

In the case which is particularly preferred in accordance with the invention, that zinc oxide is applied to the substrate as the semiconductive metal oxide, the preferred carboxylates used in this embodiment of step (A) are corresponding compounds of zinc. In a preferred embodiment, zinc carboxylate complexes with coordination numbers of 3 to 6 are used in accordance with the invention, with at least one ligand on the zinc being from the group of the mono-, di- or polycarboxylic acids or derivatives of mono-, di- or polycarboxylic acids.

In this embodiment of step (A), preference is further given to using, as precursor compounds, zinc carboxylates or derivatives thereof which decompose at a temperature of generally below 170° C. to zinc oxide and volatile products, for example carbon dioxide, acetone, etc. A minimum temperature for the decomposition of these precursor compounds is, for example, 50° C., and with catalytic activation, for example, 20° C.

Particularly preferred carboxylates used as precursor compounds in this embodiment of step (A) of the process according to the invention correspond to the general formula (VI)

(VI)

where
M is Zn
$R^3$ is hydrogen, linear or branched $C_1$-$C_{12}$-alkyl, linear or branched $C_1$-$C_{12}$-heteroalkyl, substituted or unsubstituted $C_5$-$C_{16}$-aryl, linear or branched, substituted or unsubstituted $C_5$-$C_{16}$-aralkyl, linear or branched, substituted or unsubstituted $C_5$-$C_{16}$-alkaryl, $NR^6R^7$ where $R^6$, $R^7$ are each independently Si—($C_1$-$C_6$-alkyl)$_3$ or the radical of the formula —O—C(O)—$R^4$ with the definitions of $R^4$ given below, in each case optionally substituted by functional groups with electron donor character, for example hydroxyl, amino, alkylamino, amido, ether and/or oxo,
$R^4$ is linear or branched $C_1$-$C_{12}$-alkyl, preferably $C_2$-$C_{12}$-alkyl, linear or branched $C_1$-$C_{12}$-heteroalkyl, preferably $C_2$-$C_{12}$-heteroalkyl, substituted or unsubstituted $C_5$-$C_{16}$-aryl, linear or branched, substituted or unsubstituted $C_5$-$C_{16}$-aralkyl, linear or branched, substituted or unsubstituted $C_5$-$C_{16}$-alkaryl, in each case optionally substituted by functional groups with electron donor character, for example hydroxyl, amino, alkylamino, amido, ether and/or oxo; or radicals of the formula

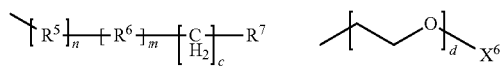

$R^5$ is selected from O and $CH_2$,
n, m, c are each independently 0, 1, 2 or 3, preferably 0, 1, 2, and more preferably 0 or 1,
$R^6$ is selected from O, C=O, —$X^4$C=CH—, $OCH_2$,
$R^7$ is selected from H, OH, $OCH_3$, $OC_2H_5$, $OSi(X^1)_{(3-a-b)}$ $(X^2)_a(X^3)_b$, $CO_2X^5$, $OCO_2X^5$, preferably from $CO_2X^5$,
$X^6$ is selected from $C_1$ to $C_4$ alkyl, preferably from methyl, ethyl and tert-butyl, most preferably from ethyl and tert-butyl,
a, b are each independently 0, 1, 2 or 3 and the sum of a and b is not more than 3,
$X^1$, $X^2$, $X^3$,
$X^4$, $X^5$ are each independently selected from H, $C_1$ to $C_{10}$ alkyl, preferably H and $C_1$ to $C_4$ alkyl, more preferably H, methyl and ethyl,
d is an integer from 1 to 100,
$X^6$ is selected from H, $C_1$ to $C_{10}$ alkyl, preferably from H and $C_1$ to $C_4$ alkyl, more preferably selected from methyl and ethyl.

The compounds of the general formula (VI) are present in solution, preferably in aqueous solution, possibly in the form of agglomerates or polycyclic adducts of two or more molecules of the general formula (VI), which are likewise encompassed by the invention.

Ligands present in very particularly preferred carboxylates, especially zinc carboxylates, are selected from the group consisting of monoalkyl 3-oxoglutarates, for example monomethyl 3-oxoglutarate, monoethyl 3-oxoglutarate, monoalkyl malonates, for example monomethyl malonate, monoethyl malonate, and mixtures thereof.

A preferred example of a zinc carboxylate which is used in step (C) of the process according to the invention as a precursor compound is the compound of the formula (VII) $Zn[(EtOC(O)CH_2C(O)CH_2COO)_2]$.

In the compounds reproduced as empirical and/or structural formulae in the present invention, solvent molecules, for example water, etc., may possibly be present in the compounds.

Processes for preparing the compound of the formula (VI) are known per se to those skilled in the art, for example by reaction of a stoichiometric amount of monoethyl 3-oxoglutarate with diethylzinc in hexane at 0° C.

A further particularly preferred example of a zinc carboxylate which is used in this embodiment of step (A) of the process according to the invention as a precursor compound, and which is in the form of an adduct of two molecules of the general formula (VI), is the compound of the formula (VIII)

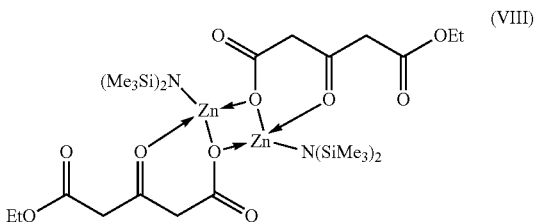

(VIII)

The compound of the formula (VIII) is likewise preparable by processes known to those skilled in the art, for example by reaction of an equimolar amount of monoethyl 3-oxoglutarate and zinc bis[bis(trimethylsilyl)amide] in benzene or toluene at room temperature.

A further particularly preferred example of a zinc carboxylate which is used in this embodiment of step (A) of the process according to the invention as a precursor compound is the compound of the formula (IX)

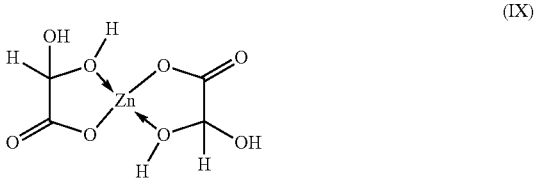

(IX)

The compound of the formula (IX) is likewise preparable by processes known to those skilled in the art.

A further preferred example of a zinc carboxylate is the compound of the formula (IXa) Zn[(NH$_2$CH$_2$COO)$_2$ (H$_2$O)] with electron donor functionality.

A further particularly preferred example of a zinc carboxylate which is used in this embodiment of step (A) of the process according to the invention as a precursor compound is the compound of the formula (IX b) Zn[{R$^8$R$^9$N—N=C(CH$_3$)CO$_2$}$_2$ (H$_2$O)$_2$], likewise with electron donor functionality in the alpha position to the carboxylate group.

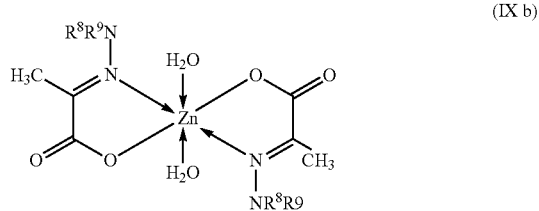

(IX b)

A further preferred example of a zinc carboxylate is the compound of the formula (IXc)

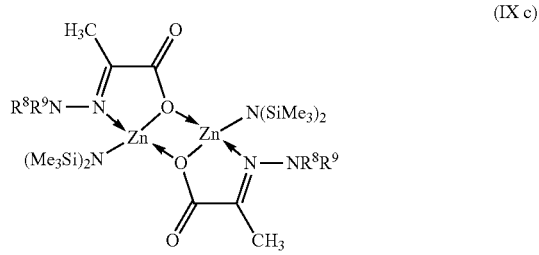

(IX c)

where R$^8$=R$^9$=methyl, or R$^8$=H and R$^9$=C(O)Me.

In this embodiment of step (A) of the process according to the invention, preference is further given to using, as the precursor compound of the at least one metal oxide, an alkoxide of the corresponding metal.

Preference is given to using metal alkoxides as precursor compounds, in which the metal atom has the coordination number of 3 to 6. In the particularly preferred case that zinc oxide is used as the semiconductive metal oxide, especially zinc alkoxide complexes with coordination numbers of 3 to 6 are used, in which at least one ligand is an alkoxide. These coordination numbers present in accordance with the invention are achieved in the precursor compounds used in accordance with the invention by additions of identical or different molecules to one another.

In a particularly preferred embodiment, the precursor compounds used are zinc alkoxides which decompose at a temperature of generally below 170° C. A minimum temperature for the decomposition of these precursor compounds is, for example, 50° C., or, for example, 20° C. with catalytic activation.

In a particularly preferred embodiment, the metal alkoxides used as precursor compounds in step (A) of the process according to the invention correspond to the following general formula (X)

(X)

where
M is Zn
R$^{19}$ is linear or branched C$_1$-C$_{12}$-alkyl, linear or branched C$_1$-C$_{12}$-heteroalkyl, substituted or unsubstituted C$_5$-C$_{16}$-aryl, linear or branched, substituted or unsubstituted C$_5$-C$_{16}$-aralkyl, linear or branched, substituted or unsubstituted C$_5$-C$_{16}$-alkaryl, preferably linear or branched C$_1$-C$_6$-alkyl, especially methyl or ethyl, in each case optionally substituted by functional groups with electron donor character, for example hydroxyl, amino, alkylamino, amido, ether and/or oxo, R$^{11}$ is hydrogen, linear or branched C$_1$-C$_{12}$-alkyl, linear or branched C$_1$-C$_{12}$-heteroalkyl, substituted or unsubstituted C$_5$-C$_{16}$-aryl, linear or branched, substituted or unsubstituted C$_5$-C$_{16}$-aralkyl, linear or branched, substituted or unsubstituted C$_5$-C$_{16}$-alkaryl, NR$^{12}$R$^{13}$ where R$^{12}$, R$^{13}$ are each independently Si—(C$_1$-C$_6$-alkyl)$_3$, or the radical of the formula —O—C(O)—R$^{10}$ with the above-specified definitions of R$^{10}$, in each case optionally substituted by functional groups with electron donor character, for example hydroxyl, amino, alkylamino, amido, ether and/or oxo; R$^{10}$ and R$^{11}$ are more preferably independently of another linear or branched C$_1$-C$_6$-alkyl, especially methyl or ethyl, o is 1 or 2 and p is 0 or 1, where the indices are selected such that o+p=2, such that electrically uncharged compounds of the general formula (X) are present, or heterocubanes, for example (Et-Zn—OEt)$_4$ or Zn$_7$O$_8$Me$_{14}$ (formula (Xb)).

Particularly preferred compounds of the general formula (X) are methoxymethylzinc or ethoxyethylzinc.

Further preferred examples of zinc alkoxides which are used as a precursor compound in this embodiment of step (A) of the process according to the invention are the compounds of the formulae (Xa), (Xb) and (Xc)

(Xa)

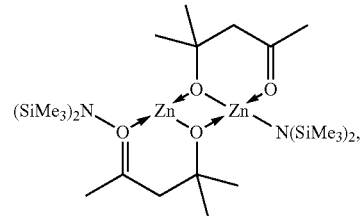

(Xb)

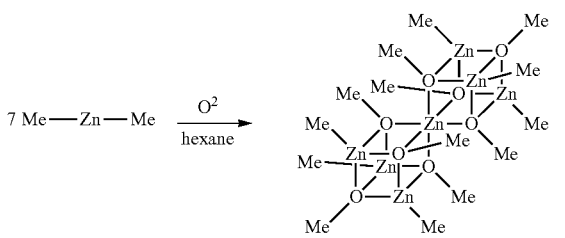

(Xc)

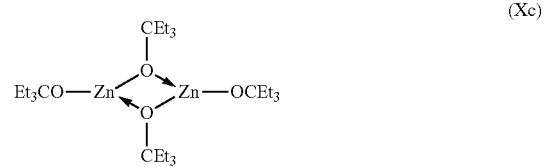

In a further preferred embodiment of the process according to the invention, the at least one precursor compound of the at least one semiconductive metal oxide used is a hydroxide, semicarbazide, carbamate, hydroxamate, isocyanate, amidine, amidrazone, urea derivative, hydroxylamine, oxime, urethane, ammonia complex, amine, amide, phosphine, ammonium compound, azide of the corresponding metal or a mixture thereof, more preferably a hydroxo complex of the corresponding metal.

Preference is given to using hydroxo-metal complexes or else aquo complexes as precursor compounds, in which the metal atom has the coordination number of 4 to 6. In the particularly preferred case that zinc oxide is used as the semiconductive metal oxide, especially zinc complexes with coordination numbers of 4 to 6 are used.

In a particularly preferred embodiment, the precursor compounds used are hydroxo-metal complexes which decompose at a temperature of generally below 150° C. to the semiconductive metal oxide and volatile products, for example ammonia. A minimum temperature for the decomposition of these precursor compounds is, for example, 50° C., or, for example, 20° C. with catalytic activation.

In a particularly preferred embodiment, these compounds correspond to the general formula (XI)

$$[(A)_q(B)_r(C)_s(OH)_tZn]_u \quad (XI)$$

where

A, B, C are each independently $R^{13}_3N$ where each $R^{13}$ is independently hydrogen, $C_1$-$C_6$-alkyl, $C_5$-$C_{12}$-aryl, $C_5$-$C_{12}$-aralkyl, $C_5$-$C_{12}$-alkaryl, $N_2R^{13}_4$ where $R^{13}$ is as defined above, $NR^{13}_2OH$ where $R^{13}$ is as defined above, $(NR^{13}_2)_2C\!=\!O$ where $R^{13}$ is as defined above, $R^{13}N\!-\!CO_2^-$ where $R^{13}$ is as defined above, $N_3^-$, $NCO^-$, acetohydrazides, amidrazones, semicarbazides, $R^{14}_3P$ where each $R^{14}$ is independently hydrogen, methyl or ethyl, $R^{14}_3As$ where $R^{14}$ is as defined above, oximes, urethanes, tetrahydrofuran (THF), diformamide, dimethylformamide (DMF), acetone, water, $C_1$-$C_{12}$-alcohols, ethers having 2 to 12 carbon atoms, for example 1,2-dimethoxyethane (DME), cyclic ethers having 4 to 12 carbon atoms, for example dioxane, especially $NH_3$ and/or OH, q, r, s, t are each independently 0-10, preferably 0-6, more preferably 0-4, preferably t=2, u is 1-10, preferably u=1, where q, r, s, t, u are selected such that electrically uncharged compounds of the general formula (XI) are present.

Particular preference is given to using, in this embodiment of step (A) of the process according to the invention, as the at least one precursor compound, the inorganic complex $[(OH)_x(NH_3)_yZn]_z$ where x, y and z are each independently 0.01 to 10, most preferably $[(OH)_x(NH_3)_yZn]_z$ where x=2, y=2 or 4 and z=1, where x, y and z are selected such that the complex specified is electrically uncharged.

The present invention therefore preferably relates to the process according to the invention wherein the at least one precursor compound of the semiconductive metal oxide used is the inorganic complex $[(OH)_x(NH_3)_yZn]_z$ where x, y and z are each independently 0.01 to 10, where x, y and z are selected such that the complex mentioned is electrically uncharged.

This preferred precursor compound can generally be prepared by all processes known to those skilled in the art, for example by reaction of zinc nitrate with sodium hydroxide solution and subsequent treatment with ammonia, for example described in S. Meiers et al., J. Am. Soc., 130 (51), 2008, 17603-17609.

In a particularly preferred embodiment, this complex is obtained by reacting zinc oxide or zinc hydroxide with ammonia.

The present invention therefore especially also relates to the process according to the invention wherein, in this embodiment of step (A), the at least one precursor compound used for the at least one semiconductive metal oxide is $[(OH)_x(NH_3)_yZn]_z$ where x, y and z are each independently 0.01 to 10, such that the complex mentioned is electrically uncharged, and is obtained by reaction of zinc oxide or zinc hydroxide with ammonia. In a particularly preferred embodiment, x=2 and y=2 or y=4 and z=1, and so particular preference is given in accordance with the invention to using $[(OH)_2(NH_3)_2Zn]$ or $[(OH)_2(NH_3)_4Zn]$.

The electrically uncharged $[(OH)_x(NH_3)_yZn]_z$ where x, y and z are each independently 0.01 to 10, which is used with preference as the precursor compound in this embodiment of step (A), is notable in that it does not comprise any impurities, for example extraneous ions such as $Na^+$, $K^+$, $NO_3^-$ etc., which originate from the reactants used for the preparation. For example, the purity of these compounds is >99%, preferably >99.5%, more preferably >99.9%. It is possible in accordance with the invention to obtain, from this particularly pure starting compound, semiconductive zinc oxide layers which likewise have a particularly high purity. This high purity has a positive effect, for example, on the semiconductive properties of the layers.

This preferred precursor compound is preferably obtained by, in a first step, initially charging solid zinc oxide or zinc hydroxide or mixtures thereof in a suitable reactor. This solid zinc oxide and/or zinc hydroxide is/are then preferably treated with a solution of ammonia ($NH_3$) in a suitable solvent.

The solvent is preferably an aqueous solvent, for example an alcoholic aqueous solution or water, more preferably water. Ammonia is present in this preferably aqueous solution in a concentration of 1 to 18 mol/l, preferably 2 to 15 mol/l, more preferably 3 to 12 mol/l, based in each case on the overall solution. A sufficient amount of the ammonia solution is added to the solid zinc oxide to obtain a reaction mixture in which zinc oxide is present generally with a concentration of 0.01 to 2 mol/l, preferably 0.1 to 1 mol/l, more preferably 0.1 to 0.5 mol/l. It is optionally also possible to work directly in liquid ammonia.

The reaction mixture thus obtained is then stirred at a temperature of generally 10 to 120° C., preferably 10 to 60° C., more preferably 20 to 30° C. In general, the suspension is stirred until complete conversion is obtained, for example 2 to 72 h, preferably 2 to 24 h. On completion of reaction, the desired product is present dissolved in the solvent, especially water. To remove any suspended substances present, the resulting solution can optionally be purified, for example by filtration. The desired product is thus obtained in particularly high purity in preferably aqueous solution.

Processes for preparing corresponding solutions or dispersions comprising semiconductive metal oxides or precursor compounds thereof are known per se to those skilled in the art.

In this embodiment of step (A) of the process according to the invention, a solution comprising the at least one precursor compound of the at least one semiconductive metal oxide in a concentration of 0.01 to 20% by weight, preferably 0.1 to 10% by weight, more preferably 0.5 to 5% by weight, based in each case on the overall solution, is used. A sufficient amount of the solution or dispersion is applied to the substrate in step (A) that a sufficiently thick semiconductor layer is obtained after the thermal treatment.

A corresponding semiconductive metal oxide layer generally has a thickness of 5 to 250 nm, preferably 5 to 50 nm.

The solution or dispersion used in this embodiment of step (A) of the process according to the invention may additionally also comprise further metal cations which serve to dope the semiconductive metal oxide. In a particularly preferred embodiment, these metal cations are selected from the group consisting of $Al^{3+}$, $In^{3+}$, $Sn^{4+}$, $Ga^{3+}$ and mixtures thereof. These metal cations can be introduced separately into the solution, or may already be present in the inventive precursor compounds.

To prepare the solution in this embodiment of step (A), the dopant metal cations mentioned may be added in the form of metal oxides, metal hydroxides, metal alkoxides, or in the form of soluble complexes. The dopants mentioned can be added to the solution in step (A) of the process according to the invention generally in an amount of 0.02 to 10 mol % based on Zn, preferably of 0.1 to 5 mol % based on Zn.

The present invention therefore also relates to the process according to the invention wherein the semiconductive metal oxide has been doped with metal cations selected from the group consisting of $Al^{3+}$, $In^{3+}$, $Sn^{4+}$, $Ga^{3+}$ and mixtures thereof.

The solution or dispersion can be applied in step (A) of the process according to the invention by all processes for liquid processing which are known to those skilled in the art and which are suitable for applying the solutions or dispersions to the substrate, for example spin-coating, spray-coating, dip-coating, drop-casting or printing, for example inkjet printing, flexographic printing or gravure printing.

In a preferred embodiment, the present invention therefore relates to the process according to the invention wherein the solution or dispersion is applied in step (A) by spin-coating, spray-coating, dip-coating, drop-casting and/or printing.

The solution or dispersion is more preferably applied in step (A) by spin-coating or ink-jet printing. These processes are known per se to those skilled in the art.

The present invention therefore relates more particularly to the process according to the invention wherein the solution or dispersion is applied in step (A) by spin-coating.

In general, it is possible by the process according to the invention to coat all substrates known to those skilled in the art, for example Si wafers, glass, ceramics, metals, metal oxides, semimetal oxides, polymers, such as polyethylene terephthalate (PET), polyethylene naphthalate (PEN), polyimides, polycarbonates, polyacrylates, polystyrenes, polysulfones, etc.

In a preferred embodiment of the process according to the invention, the substrate is selected from flexible polymers, for example selected from the group consisting of polyesters, for example polyethylene terephthalate (PET), polyethylene naphthalate (PEN), polyimides and mixtures thereof.

The present invention therefore also relates to the process according to the invention wherein the substrate is a flexible substrate. More particularly, the present invention relates to the process according to the invention wherein the flexible substrate is selected from the group consisting of polyesters, for example polyethylene terephthalate (PET), polyethylene naphthalate (PEN), polyimides and mixtures thereof.

In step (A) of the process according to the invention, the substrates mentioned can be coated as such with the solutions or dispersions mentioned, i.e. the solutions or dispersions are applied directly to the substrate in step (A).

Depending on the desired geometry, the substrates which are used in step (A) may also already have other, optionally structured layers, for example source, drain or gate electrodes. These can be applied by processes known to those skilled in the art, for example by thermal vapor deposition, sputtering methods or printing, for example as described in WO 2005/093848.

Step (A) of the process according to the invention is generally performed at room temperature.

Step (A) affords a substrate which, according to the first embodiment, has been coated with a solution comprising a dielectric or a precursor compound thereof based on organically modified silica compounds, especially based on silsesquioxanes and/or siloxanes, or which, according to the second embodiment, has been coated with a solution or dispersion comprising at least one semiconductive metal oxide or a precursor compound thereof.

Step (B):

Step (B) of the process according to the invention comprises the thermal treatment of the coated substrate from step (A) at a temperature from room temperature to 350° C. in order to obtain a substrate coated with the dielectric or the semiconductive metal oxide.

In general, step (B) can be performed with all apparatus known to those skilled in the art for heating substrates, for example a hotplate, an oven, a drying cabinet, a hot air gun, a belt calciner or a climate-controlled cabinet.

In step (B), in a first embodiment, the solution comprising a dielectric or a precursor compound thereof based on organically modified silica compounds, especially based on silsesquioxanes and/or siloxanes, which is present on the substrate is converted to a solid dielectric layer. In a second embodiment of step (B), the solution or dispersion comprising at least one semiconductive metal oxide or a precursor compound thereof is converted to a semiconductive metal oxide layer.

According to the invention, it is possible that, in the first embodiment of step (B), exclusively the solvent is removed by evaporation in order to obtain a solid dielectric based on organically modified silica compounds, especially based on silsesquioxanes and/or siloxanes. According to the invention, it is also possible that silsesquioxane units present as a result of the thermal treatment in step (B) and the abovementioned further units which may be present are (co)polymerized with one another and/or crosslinked. It is also possible that a combination of these two operations takes place in step (B).

The first embodiment of step (B) of the process according to the invention is performed at a temperature from room temperature to 350° C., preferably 100 to 350° C., more preferably 100 to 250° C., even more preferably 100 to 170° C., especially 140 to 160° C., for example at 150° C.

By virtue of these low temperatures, it is especially possible to use flexible polymer substrates which do not deform and are not thermally degraded during the production of the dielectric layer.

The first embodiment of step (B) of the process according to the invention can be performed in an inert or oxidizing atmosphere or under reduced pressure, for example under nitrogen, argon etc., or under air, preferably under air.

On completion of heating, the coated substrate can be subjected to further treatment processes known to those skilled in the art, for example to a plasma treatment.

The present invention therefore preferably relates to the process according to the present invention, wherein after step (B) and/or after step (D), preferably after step (B), particularly preferably, if in step (A) a solution comprising at least one dielectric or a precursor thereof which is based on organically modified silica compounds has been applied, a plasma treatment is conducted.

Plasma treatment which is preferred according to the present invention, preferably an oxygen plasma treatment, is itself known to those skilled in the art.

In step (B), according to the first embodiment of the process according to the invention, a substrate coated with a dielectric based on organically modified silica compounds, especially based on silsesquioxanes and/or siloxanes, is obtained, which may optionally also have further layers, for example source, drain and/or gate electrodes.

In the second embodiment of step (B) of the process according to the invention, the solution or dispersion comprising a semiconductive metal oxide or a precursor compound thereof which is present on the substrate is converted to a solid semiconductive metal oxide layer.

According to the invention, it is possible that, in this embodiment of step (B), exclusively the solvent or dispersant is removed by evaporation in order to obtain a solid semiconductive metal oxide layer on the dielectric. According to the invention, it is also possible that the thermal treatment in step (B) removes ligands or converts precursor compounds present to the semiconductive metal oxide.

In this embodiment, step (B) of the process according to the invention is performed at a temperature from room temperature to 350° C., preferably 100 to 350° C., more preferably 100 to 250° C., even more preferably 100 to 170° C., especially 140 to 160° C., for example at 150° C.

In this embodiment, step (B) of the process according to the invention can likewise be performed in an inert or oxidizing atmosphere or under reduced pressure, for example under nitrogen, argon etc., or under air, preferably under air.

Step (B) according to this second embodiment affords a substrate which has been provided with a solid semiconductive metal oxide layer and optionally further layers, for example source, drain and/or gate electrodes.

After step (B) of the process according to the invention, it is possible in both embodiments for further treatment processes known to those skilled in the art to be carried out in order to obtain an electronic component, for example thermal vapor deposition of aluminum in order to produce electrical contacts, especially source and/or drain contacts, if this has not already been done before step (A). These further treatment processes can also be effected in or after later process steps.

Step (C):

In the first embodiment, step (C) of the process according to the invention comprises, if a solution comprising at least one dielectric or a precursor compound thereof based on organically modified silica compounds has been applied in step (A), the single or repeated application of a solution or dispersion comprising at least one semiconductive metal oxide or a precursor compound thereof to the substrate from step (B), or in a second embodiment, if a solution or dispersion comprising at least one semiconductive metal oxide or a precursor compound has been applied in step (A), the single or repeated application of a solution comprising at least one dielectric or a precursor compound thereof based on organically modified silica compounds to the substrate from step (B), in order to obtain a substrate coated with a corresponding solution or dispersion.

According to the geometry desired in the electronic component to be produced, in step (A) of the process according to the invention, either a dielectric layer (first embodiment) or a semiconductive metal oxide layer (second embodiment) is applied.

In step (C) of the process according to the invention, the other layer in each case is now applied, i.e., in the first embodiment, a solution or dispersion comprising at least one semiconductive metal oxide or a precursor compound thereof is applied in step (C), or, in the second embodiment, a solution of at least one dielectric or of a precursor compound thereof based on organically modified silica compounds is applied in step (C).

With regard to the corresponding at least one dielectric or a precursor compound thereof based on organically modified silica compounds and the semiconductive metal oxide or a precursor compound thereof, reference is made to the statements regarding step (A).

The coating in step (C) of the process according to the invention can generally be effected by all processes for liquid processing which are known to those skilled in the art and which are suitable for applying the solution to the substrate, for example spin-coating, spray-coating, dip-coating, drop-casting or printing, for example inkjet printing, flexographic printing or gravure printing.

In a preferred embodiment, the present invention therefore relates to the process according to the invention wherein the coating in step (C) is effected by spin-coating, spray-coating, dip-coating, drop-casting and/or printing.

More particularly, the present invention relates to the process according to the invention wherein the coating in step (A) and/or (C) is effected by spin-coating, spray-coating, dip-coating, drop-casting and/or printing.

Particular preference is given to applying the coating in step (C) by spin-coating or ink-jet printing. These processes are known per se to those skilled in the art.

Step (C) of the process according to the invention is generally performed at room temperature.

In a first embodiment, step (C) of the process according to the invention affords a substrate which has been coated with a solution or dispersion of at least one semiconductive metal oxide or a precursor compound thereof and has a dielectric layer. A second embodiment affords a substrate which has been coated with a solution comprising a dielectric or a precursor compound thereof based on organically modified silica compounds and has a semiconductive metal oxide layer. In both embodiments, further layers may be present.

Step (D):

Step (D) of the process according to the invention comprises the thermal treatment of the coated substrate from step (C) at a temperature from room temperature to 350° C. in order to obtain a substrate coated with the dielectric or the semiconductive metal oxide.

In general, step (D) can be performed with all apparatus known to those skilled in the art for heating substrates, for example a hotplate, an oven, a drying cabinet, a hot airgun, a belt calciner or a climate-controlled cabinet.

Step (D) of the process according to the invention is generally performed at a temperature from room temperature to 350° C., preferably 100 to 350° C., more preferably 100 to 250° C., even more preferably 100 to 170° C., especially 140 to 160° C., for example at 150° C.

In a particularly preferred embodiment, the present invention relates to the process according to the invention wherein step (B) and/or step (D) is performed at a temperature of 100 to 170° C., especially 140 to 160° C., for example at 150° C.

Step (D) is generally performed analogously to step (B).

Electronic components producible in accordance with the invention are, for example, FETs (field-effect transistors), or components which comprise them, such as RFID tags, displays or CMOS architectures.

The process according to the invention is notable in that, in accordance with the invention, the dielectric layer and the semiconductive metal oxide layer can be produced at temperatures of room temperature to 350° C., preferably 100 to 170° C., such that it is also possible to coat polymer substrates without thermal deformation or thermal degradation thereof. A route is thus provided to electronic components based on flexible substrates. It is a further advantage of the present invention that it is notable for a particularly simple, inexpensive and extensive process regime. More particularly, this includes the option of processibility of dielectric and semiconductor material from solution, which enables, for example, the use of printing techniques, and the use of mostly nontoxic, oxidation-insensitive metal oxides which are extremely simple and inexpensive to synthesize and are optically transparent, especially ZnO, instead of organic materials as the semiconductor material, especially n-semiconductor material. In addition, the invention is notable for a particularly suitable selection of dielectric and semiconductor material with regard to the operability of electronic components, especially FETs.

The present invention therefore also relates to an electronic component, preparable by the process according to the present invention.

Furthermore, the present invention also relates to an electronic component, comprising at least a flexible substrate selected from the group consisting of polyesters, for example polyethylene terephthalate (PET), polyethylene naphthalate (PEN), polyimides, polycarbonates, polysulfones and mixtures thereof, at least one dielectric which is based on organically modified silica compounds, and at least one semiconductive metal oxide.

In a preferred embodiment of the present invention, the electronic component according to the present invention is a FET.

The present invention therefore preferably relates to the electronic component according to the present invention, wherein it is a FET.

In respect of the electronic component according to the present invention for the single general and preferred embodiments, the same applies as mentioned in respect of the process according to the present application. In particular, the above-mentioned applies in respect of the at least one substrate, in respect of the at least one dielectric which is based on organically modified silica compounds and in respect of the at least one semiconductive metal oxide.

This electronic component according to the present invention can in general be prepared according to all processes known to those skilled in the art. Preferably, the electronic component according to the present invention is prepared according to the above-mentioned process according to the present invention.

In the electronic component according to the present invention, all conceivable geometries are obtainable, especially the following:
1: Substrate, dielectric, semiconductor, preferably substrate, gate, dielectric, semiconductor, source and drain, known to those skilled in the art as bottom gate top contact.
2: Substrate, dielectric, semiconductor, preferably substrate, gate, dielectric, source and drain, semiconductor, known to those skilled in the art as bottom gate bottom contact.
3: Substrate, semiconductor, dielectric, preferably substrate, source and drain, semiconductor, dielectric, gate, known to those skilled in the art as top gate bottom contact.
4: Substrate, semiconductor, dielectric, preferably substrate, semiconductor, source and drain, dielectric, gate, known to those skilled in the art as top gate top contact.

The organically modified silica compounds on which the dielectric of the electronic component according to the present application is based, are preferably silsesquioxanes and/or siloxanes, which are applied in solution, i.e. which are processed from solution. In respect of the silsesquioxanes and siloxanes, the above-mentioned applies.

In the electronic component according to the present invention, generally all metal oxides known to be suitable to those skilled in the art can be used as at least one semiconductive metal oxide, preferably selected from zinc-oxide (ZnO), indium oxide, gallium oxide, tin oxide, aluminum oxide, cadmium oxide and mixed oxides, and also doped metal oxides and mixed oxides thereof, very particular preference being given to ZnO and doped ZnO, doped for example with Al, Ga, In and/or Sn. In respect of the further embodiments, the above-mentioned applies.

Therefore, the present invention also preferably relates to the electronic component according to the present invention, wherein the at least one semiconductive metal oxide is ZnO.

In a preferred embodiment of the electronic component according to the present application, the semiconductive metal oxide is ZnO, which is prepared from the inorganic complex $[(OH)_x(NH_3)_yZn]_z$ mit x, y and z being independently of another 0.01 to 10, wherein x, y and z are selected such that the complex specified is electrically uncharged.

The present invention therefore in particular relates to the electronic component according to the present invention, wherein the semiconductive metal oxide is ZnO, which is prepared from the inorganic complex $[(OH)_x(NH_3)_yZn]_z$ mit x, y and z being independently of another 0.01 to 10, wherein x, y and z are selected such that the complex specified is electrically uncharged.

Furthermore, the present invention also relates to an electronic component comprising at least one substrate, at least one dielectric which is based on organically modified silica compounds being processed from solution, and at least one semiconductive metal oxide being processed from solution.

In this embodiment of the electronic component according to the present application, as preferred dielectrics which are processed from solution the above-mentioned dielectrics, particularly preferably the above-mentioned organically modified silica compounds, and the above-mentioned precursors of the dielectric, are used. Furthermore, as semiconductive metal oxide which is processed from solution, the above-mentioned semiconductive metal oxides, preferably ZnO, and the above-mentioned precursors of the semiconductive metal oxide, are used.

In this embodiment, the substrate is in general selected from the group consisting of Si-wafers, glass, ceramics, metals, metal oxides, semimetal oxides, polymers, such as polyethylene terephthalate (PET), polyethylene naphthalate (PEN), polyimides, polycarbonates, polyacrylates, polystyrenes, polysulfones and mixtures thereof.

In a particularly preferred embodiment, the present invention relates to an electronic component, preferably a FET, according to the present invention, wherein it comprises a polyethylene naphthalate-substrate or polyethylene terephthalate-substrate, preferably a polyethylene naphthalate-film substrate or polyethylene terephthalate-film substrate, with gate-contact, preferably an aluminum-gate-contact, a ZnO-semiconductive material being processed from a $[(OH)_x(NH_3)_yZn]_z$ solution where x, y and z are each independently 0.01 to 10, where x, y and z are selected such that the complex mentioned is electrically uncharged, preferably possessed from a $[(OH)_2(NH_3)_4Zn]$ solution, a silsesquioxane-dielectric which is processed from a ethyl lactate-solution of a glass resin comprising methyl- and phenyl silsesquioxane-units and source-drain-contacts, preferably made of aluminum.

The present invention further relates to the use of organically modified silica compounds for the preparation of electronic components, comprising at least one flexible substrate, selected from the group consisting of polyesters, for example polyethylene terephthalate (PET), ethylene naphthalate (PEN), polyimides, polycarbonates, polysulfones and mixtures thereof, at least one dielectric based on these organically modified silica compounds and at least one semiconductive metal oxide.

The present invention further relates to the use of organically modified silica compounds for the preparation of electronic components, comprising at least one substrate, a dielectric based on these organically modified silica compounds which is processed from solution and at least one semiconductive metal oxide which is processed from solution The present invention preferably relates to the use according to the present invention, wherein the semiconductive metal oxide is ZnO, which is prepared from the inorganic complex $[(OH)_x(NH_3)_yZn]_z$ mit x, y and z where x, y and z are each independently 0.01 to 10, where x, y and z are selected such that complex specified is electrically uncharged.

The present invention further relates preferably to the use according to the present invention, wherein the electronic component is a FET.

In respect of organically modified silica compounds, the preparation of electronic components, in particular in respect of the process according to the present invention, and of the electronic components themselves, in particular of the substrates, the above-mentioned applies.

FIGURES

Figure 2:
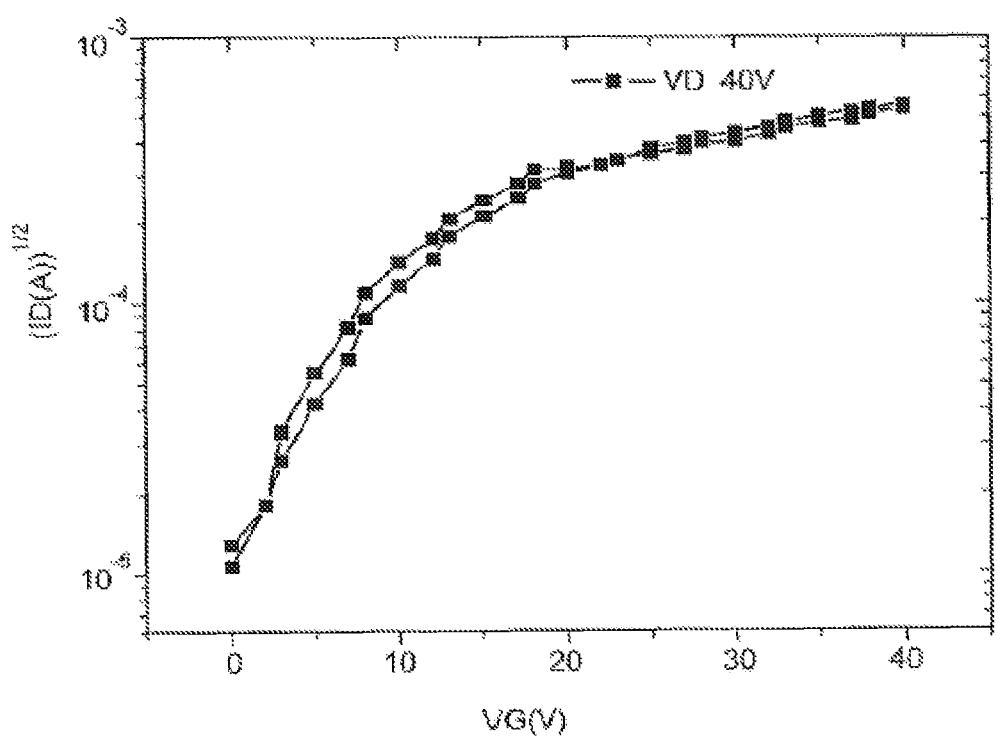

FIG. 1 shows a representative output curve for an inventive transistor. In this figure:
VD voltage between source and drain
ID current between source and drain
FIG. 2 shows a representative transfer curve for an inventive transistor. In the figure:
VG voltage between source and gate
ID current between source and drain

EXAMPLES

Example 1

Preparation of $Zn(OH)_2(NH_3)_4$

A 500 ml four-neck flask is initially charged with 6.10 g of ZnO (Pharmaceutical quality, Umicore). 500 ml of a 6.6 mol/l $NH_3/H_2O$ solution are added. The suspension is stirred at 300 rpm at room temperature overnight. This gives a clear solution with a low level of suspended substances, which are removed by means of a glass frit so as to obtain a clear solution of the complex mentioned. Elemental analysis of the solution gives a Zn content of 1.0 g/100 g of solution.

Example 2

Production of a ZnO FET on Polyethylene Naphthalate (PEN) Film Substrate with ZnO Semiconductor Material Processed from Solution and Silsesquioxane Dielectric Processed from Solution A 25% by weight solution of GR 150 glass resin (Techneglass, Inc.) consisting of methyl- and phenylsilsesquioxane units in ethyl lactate is spun (60 s, 3000 rpm) onto cleaned PEN film substrate (Teonex, DuPont Teijin Films) with a 75 nm aluminum gate (applied by thermal vapor deposition), and then heated at 80° C. for 1 minute and at 150° C. for 1 hour. After oxygen plasma treatment (30 s), the $Zn(OH)_2(NH_3)_4$ solution from example 1 is spun on (30 s, 3000 rpm) and heated at 150° C. for 1 h. Source/drain contacts (channel width/length ratio: 20) are obtained by thermal vapor deposition of aluminum.

The following average parameters are determined:
Mobility $\mu$: $2 \ast 10^{-2}$ cm$^2$/(V*s)
On/off ratio: $10^3$,
$V_T$ threshold voltage: 5 V

The invention claimed is:

1. A process for producing an electronic component comprising at least one substrate, at least one dielectric and at least one semiconductive metal oxide, comprising the steps of:
   (A) singly or repeatedly applying a solution comprising at least one dielectric or a precursor compound thereof based on organically modified silica compounds to the at least one substrate in order to obtain a first coated substrate,
   wherein the organically modified silica compounds comprise at least one unit selected from the units of the general formulae (I) to (V), and are based on silsesquioxanes and/or siloxanes, where single oxygen bridges are present between the silicon atoms of each unit represented by formulae (I) to (V):

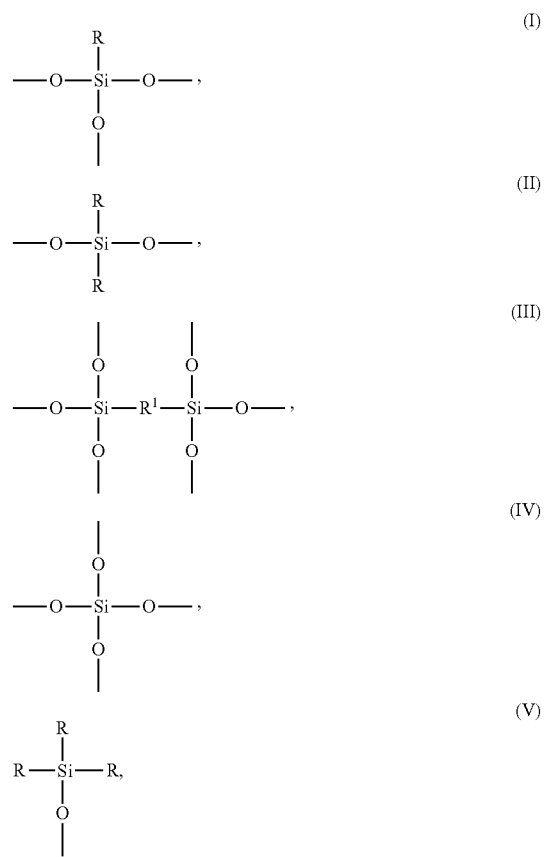

where R and $R^1$ may each be defined as follows:
R is independently
hydrogen;
linear or branched, substituted or unsubstituted $C_1$-$C_{20}$-alkyl, optionally interrupted by at least one heteroatom, at least partly halogenated;
linear or branched, substituted or unsubstituted $C_1$-$C_{20}$-alkyl, optionally interrupted by at least one heteroatom;
substituted or unsubstituted $C_3$-$C_{20}$-cycloalkyl, optionally attached via a linear or branched $C_1$-$C_{20}$-alkyl chain;

linear or branched, substituted or unsubstituted, at least monounsaturated $C_2$-$C_{20}$-alkenyl, optionally interrupted by at least one heteroatom;

linear or branched, substituted or unsubstituted, at least monounsaturated $C_2$-$C_{20}$-alkynyl, optionally interrupted by at least one heteroatom;

substituted or unsubstituted $C_5$-$C_{30}$-aryl, optionally attached via a linear or branched $C_1$-$C_{20}$-alkyl chain, $R^1$ is a linear or branched $C_1$-$C_{20}$-alkylidene, -alkenylidene or -alkynylidene group, which may optionally be interrupted by functional groups including aromatics or heteroaromatics or heteroatoms including O, S, P or N, or substituted or unsubstituted $C_5$-$C_{30}$-arylene, or singly or repeatedly applying a solution or dispersion comprising at least one semiconductive metal oxide or a precursor compound thereof to the at least one substrate in order to obtain a second coated substrate, then (B) thermally treating the first coated substrate or the second coated substrate from step (A) at a temperature from room temperature to 350° C., in order to obtain a first treated substrate or a second treated substrate, respectively, then (C) if a solution comprising at least one dielectric or a precursor compound thereof based on organically modified silica compounds has been applied in step (A), singly or repeatedly applying a solution or dispersion comprising at least one semiconductive metal oxide or a precursor compound thereof to the first treated substrate from step (B) in order to obtain a first coated treated substrate, or if a solution or dispersion comprising at least one semiconductive metal oxide or a precursor compound has been applied in step (A), singly or repeatedly applying a solution comprising at least one dielectric or a precursor compound thereof based on organically modified silica compounds to the second treated substrate from step (B) in order to obtain a second coated treated substrate, wherein the organically modified silica compounds comprise at least one unit selected from the units of the general formulae (I) to (V), and are based on silsesquioxanes and/or siloxanes, where single oxygen bridges are present between the silicon atoms of each unit represented by formulae (I) to (V):

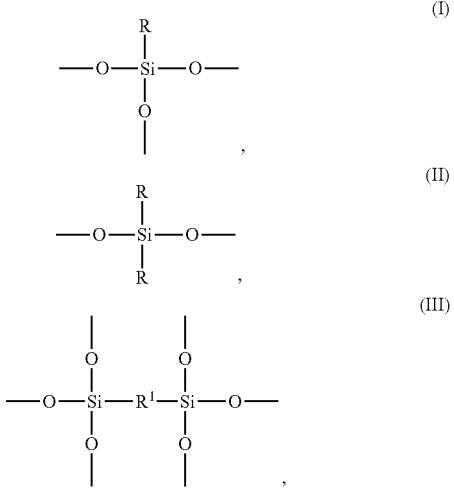

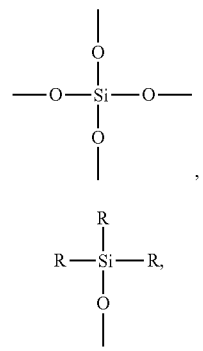

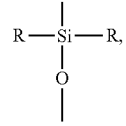

where R and $R^1$ may each be defined as follows:

R is independently hydrogen;

linear or branched, substituted or unsubstituted $C_1$-$C_{20}$-alkyl, optionally interrupted by at least one heteroatom, at least partly halogenated;

linear or branched, substituted or unsubstituted $C_1$-$C_{20}$-alkyl, optionally interrupted by at least one heteroatom;

substituted or unsubstituted $C_3$-$C_{20}$-cycloalkyl, optionally attached via a linear or branched $C_1$-$C_{20}$-alkyl chain;

linear or branched, substituted or unsubstituted, at least monounsaturated $C_2$-$C_{20}$-alkenyl, optionally interrupted by at least one heteroatom;

linear or branched, substituted or unsubstituted, at least monounsaturated $C_2$-$C_{20}$-alkynyl, optionally interrupted by at least one heteroatom;

substituted or unsubstituted $C_5$-$C_{30}$-aryl, optionally attached via a linear or branched $C_1$-$C_{20}$-alkyl chain, $R^1$ is a linear or branched $C_1$-$C_{20}$-alkylidene, -alkenylidene or -alkynylidene group, which may optionally be interrupted by functional groups including aromatics or heteroaromatics or heteroatoms including O, S, P or N, or substituted or unsubstituted $C_5$-$C_{30}$-arylene, and then (D) thermally treating the first coated treated substrate or the second coated treated substrate from step (C) at a temperature from room temperature to 350° C.

2. The process according to claim 1, wherein the at least one semiconductive metal oxide is ZnO.

3. The process according to claim 1, wherein the semiconductive metal oxide is used in step (A) or (C) in the form of the metal oxide in dispersion or as a precursor compound.

4. The process according to claim 1, wherein the at least one precursor compound of the semiconductive metal oxide used is the inorganic complex $[(OH)_x(NH_3)_yZn]_z$ where x, y and z are each independently 0.01 to 10, where x, y and z are selected such that the complex mentioned is electrically uncharged.

5. The process according to claim 1, wherein step (B) and/or step (D) is performed at a temperature of 100 to 170° C.

6. The process according to claim 1, wherein the coating in step (A) and/or (C) is effected by spin-coating, spray-coating, dip-coating, drop-casting and/or printing.

7. The process according to claim 1, wherein the at least one substrate is a flexible substrate.

8. The process according to claim 7, wherein the flexible substrate is selected from the group consisting polyethylene terephthalate (PET), polyethylene naphthalate (PEN), polyimides, polycarbonates, polysulfones and mixtures thereof.

9. The process according to claim 1, wherein the solvent for the solution comprising at least one dielectric based on organically modified silica compounds or a precursor compound thereof is selected from the group consisting of alcohols, water, esters, carboxylic acids, amines, amides, ethers, aldehydes, ketones, aromatics and mixtures thereof.

10. The process according to claim 1, wherein the solvent or dispersant for the solution or dispersion comprising at least one semiconductive metal oxide or a precursor compound thereof is selected from the group consisting of alcohols, water, esters, carboxylic acids, amines, amides, ethers, aldehydes, ketones, aromatics and mixtures thereof.

11. The process according to claim 1, wherein the semiconductive metal oxide has been doped with metal cations selected from the group consisting of $Al^{3+}$, $In^{3+}$, $Sn^{4+}$, $Ga^{3+}$ and mixtures thereof.

12. The Process according to claim 1, wherein after step (B) and/or after step (D) a plasma treatment is conducted.

13. Electronic component, prepared by a process comprising the steps of:
(A) singly or repeatedly applying a solution comprising at least one dielectric or a precursor compound thereof based on organically modified silica compounds to at least one substrate in order to obtain a first coated substrate,
wherein the solution comprising the at least one dielectric or a precursor compound thereof based on organically modified silica compounds is applied in an amount sufficient to obtain a dielectric layer having a thickness of 100 nm to 2 μm after step (B),
wherein the organically modified silica compounds comprise at least one unit selected from the units of the general formulae (I) to (V), and are based on silsesquioxanes and/or siloxanes, where single oxygen bridges are present between the silicon atoms of each unit represented by formulae (I) to (V):

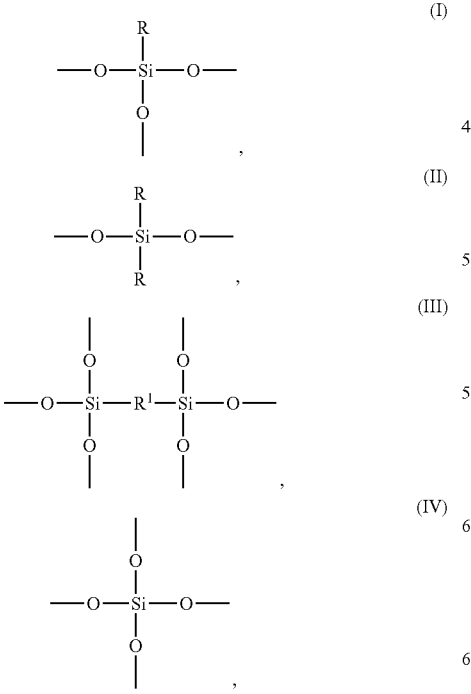

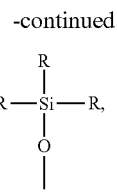

where R and $R^1$ may each be defined as follows:
R is independently
hydrogen;
linear or branched, substituted or unsubstituted $C_1$-$C_{20}$-alkyl, optionally interrupted by at least one heteroatom, at least partly halogenated;
linear or branched, substituted or unsubstituted $C_1$-$C_{20}$-alkyl, optionally interrupted by at least one heteroatom;
substituted or unsubstituted $C_3$-$C_{20}$-cycloalkyl, optionally attached via a linear or branched $C_1$-$C_{20}$-alkyl chain;
linear or branched, substituted or unsubstituted, at least monounsaturated $C_2$-$C_{20}$-alkenyl, optionally interrupted by at least one heteroatom;
linear or branched, substituted or unsubstituted, at least monounsaturated $C_2$-$C_{20}$-alkynyl, optionally interrupted by at least one heteroatom;
substituted or unsubstituted $C_5$-$C_{30}$-aryl, optionally attached via a linear or branched $C_1$-$C_{20}$-alkyl chain,
$R^1$ is a linear or branched $C_1$-$C_{20}$-alkylidene, -alkenylidene or -alkynylidene group, which may optionally be interrupted by functional groups including aromatics or heteroaromatics or heteroatoms including O, S, P or N, or substituted or unsubstituted $C_5$-$C_{30}$-arylene,
or
singly or repeatedly applying a solution or dispersion comprising at least one semiconductive metal oxide or a precursor compound thereof to at least one substrate in order to obtain a second coated substrate,
wherein the solution or dispersion comprising the at least one semiconductive metal oxide or a precursor compound thereof is applied in an amount sufficient to obtain a semiconductive layer having a thickness of 5 nm to 250 nm after step (B), and
wherein the at least one semiconductive metal oxide is ZnO, which is prepared from an inorganic complex $[(OH)_x(NH_3)_yZn]_z$ where x, y and z being independently of another 0.01 to 10, wherein x, y and z are selected such that the complex specified is electrically uncharged, and
wherein the purity of the inorganic complex $[(OH)_x(NH_3)_yZn]_z$ is higher than 99%,
then (B) thermally treating the first coated substrate or the second coated substrate from step (A) at a temperature from room temperature to 350° C., in order to obtain a first treated substrate or a second treated substrate, respectively,
then (C) if a solution comprising at least one dielectric or a precursor compound thereof based on organically modified silica compounds has been applied in step (A), singly or repeatedly applying a solution or dispersion comprising at least one semiconductive metal oxide or a precursor compound thereof to the first treated substrate from step (B) in order to obtain a first coated treated substrate,
wherein the at least one semiconductive metal oxide is ZnO, which is prepared from an inorganic complex $[(OH)_x(NH_3)_yZn]_z$ where x, y and z being independently of another 0.01 to 10, wherein x, y and z are selected such that the complex specified is electrically uncharged, and wherein the purity of the inorganic complex $[(OH)_x(NH_3)_y Zn]_z$ is higher than 99%, or if a solution or dispersion comprising at least one semiconductive metal oxide or a precursor compound has been applied in step (A), singly or repeatedly applying a solution comprising at least one dielectric or a precursor compound thereof based on organically modified silica compounds to the second treated substrate from step (B) in order to obtain a second coated treated substrate, wherein the organically modified silica compounds comprise at least one unit selected from the units of the general formulae (I) to (V), and are based on silsesquioxanes and/or siloxanes, where single oxygen bridges are present between the silicon atoms of each unit represented by formulae (I) to (V):

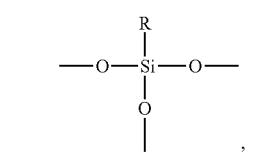

(I)

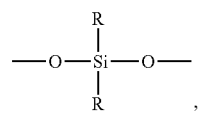

(II)

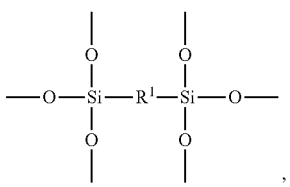

(III)

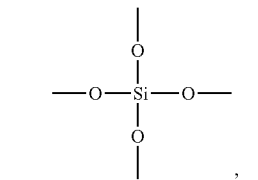

(IV)

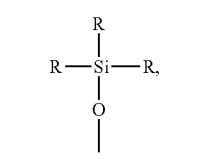

(V)

where R and $R^1$ may each be defined as follows:
R is independently
hydrogen;
linear or branched, substituted or unsubstituted $C_1$-$C_{20}$-alkyl, optionally interrupted by at least one heteroatom, at least partly halogenated;
linear or branched, substituted or unsubstituted $C_1$-$C_{20}$-alkyl, optionally interrupted by at least one heteroatom;
substituted or unsubstituted $C_3$-$C_{20}$-cycloalkyl, optionally attached via a linear or branched $C_1$-$C_{20}$-alkyl chain;
linear or branched, substituted or unsubstituted, at least monounsaturated $C_2$-$C_{20}$-alkenyl, optionally interrupted by at least one heteroatom;

linear or branched, substituted or unsubstituted, at least monounsaturated $C_2$-$C_{20}$-alkynyl, optionally interrupted by at least one heteroatom;

substituted or unsubstituted $C_5$-$C_{30}$-aryl, optionally attached via a linear or branched $C_1$-$C_{20}$-alkyl chain, $R^1$ is a linear or branched $C_1$-$C_{20}$-alkylidene, -alkenylidene or -alkynylidene group, which may optionally be interrupted by functional groups including aromatics or heteroaromatics or heteroatoms including O, S, P or N, or substituted or unsubstituted $C_5$-$C_{30}$-arylene, and then (D) thermally treating the first coated treated substrate or the second coated treated substrate from step (C) at a temperature from room temperature to 350° C.

14. Electronic component, comprising at least one flexible substrate selected from the group consisting of polyethylene terephthalate (PET), polyethylene naphthalate (PEN), polyimides, polycarbonates, polysulfones and mixtures thereof, at least one dielectric which is based on organically modified silica compounds, and at least one semiconductive metal oxide, wherein the at least one dielectric is comprised in a dielectric layer having a thickness of 100 nm to 2 μm, wherein the at least one semiconductive metal oxide is comprised in a semiconductor layer having a thickness of 5 nm to 250 nm, wherein the at least one semiconductive metal oxide is ZnO, which is prepared from an inorganic complex $[(OH)_x(NH_3)_y Zn]_z$ where x, y and z being independently of another 0.01 to 10, wherein x, y and z are selected such that the complex specified is electrically uncharged, and wherein the purity of the inorganic complex $[(OH)_x(NH_3)_y Zn]_z$ is higher than 99%, wherein the organically modified silica compounds comprise at least one unit selected from the units of the general formulae (I) to (V), and are based on silsesquioxanes and/or siloxanes, where single oxygen bridges are present between the silicon atoms of each unit represented by formulae (I) to (V):

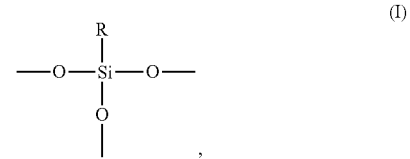

(I)

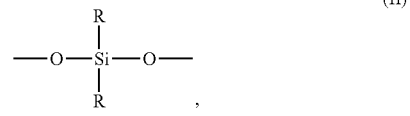

(II)

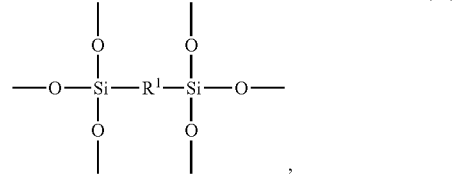

(III)

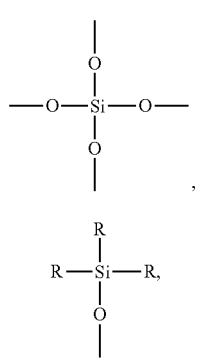

where R and R¹ may each be defined as follows:
R is independently
hydrogen;
linear or branched, substituted or unsubstituted $C_1$-$C_{20}$-alkyl, optionally interrupted by at least one heteroatom, at least partly halogenated;
linear or branched, substituted or unsubstituted $C_1$-$C_{20}$-alkyl, optionally interrupted by at least one heteroatom;
substituted or unsubstituted $C_3$-$C_{20}$-cycloalkyl, optionally attached via a linear or branched $C_1$-$C_{20}$-alkyl chain;
linear or branched, substituted or unsubstituted, at least monounsaturated $C_2$-$C_{20}$-alkenyl, optionally interrupted by at least one heteroatom;
linear or branched, substituted or unsubstituted, at least monounsaturated $C_2$-$C_{20}$-alkynyl, optionally interrupted by at least one heteroatom;
substituted or unsubstituted $C_5$-$C_{30}$-aryl, optionally attached via a linear or branched $C_1$-$C_{20}$-alkyl chain,
R¹ is a linear or branched $C_1$-$C_{20}$-alkylidene, -alkenylidene or -alkynylidene group, which may optionally be interrupted by functional groups including aromatics or heteroaromatics or heteroatoms including O, S, P or N, or substituted or unsubstituted $C_5$-$C_{30}$-arylene,
wherein the organically modified silica compounds are processed from solution, and the semiconductive metal oxide is processed from solution.

15. Electronic component according to claim 14 is a FET (field-effect transistor).

16. Electronic component according to claim 14, comprises at least one polyethylene naphthalate-substrate or polyethylene terephthalate-substrate with gate-contact, a ZnO-semi-conductive material being processed from a $[(OH)_x(NH_3)_yZn]_z$ solution where x, y and z are each independently 0.01 to 10, where x, y and z are selected such that the complex mentioned is electrically uncharged, a silsesquioxane-dielectric which is processed from a ethyl lactate-solution of a glass resin comprising methyl- and phenyl silsequioxane-units and source-drain-contacts.

17. Method of using organically modified silica compounds for the preparation of electronic components based on at least one flexible substrate, comprising the steps of:
processing from solution at least one dielectric based on the organically modified silica compounds, and
processing from solution at least one semiconductive metal oxide ZnO, which is prepared from an inorganic complex $[(OH)_x(NH_3)_yZn]_z$ where x, y and z being independently of another 0.01 to 10, wherein x, y and z are selected such that the complex specified is electrically uncharged, and wherein the purity of the inorganic complex $[(OH)_x(NH_3)_yZn]_z$ is higher than 99%,
wherein the electronic components comprise:
the at least one flexible substrate selected from the group consisting of polyethylene terephthalate (PET), ethylene naphthalate (PEN), polyimides, polycarbonates, polysulfones and mixtures thereof,
the at least one dielectric based on the organically modified silica compounds and
the at least one semiconductive metal oxide ZnO,
wherein the organically modified silica compounds comprise at least one unit selected from the units of the general formulae (I) to (V), and are based on silsesquioxanes and/or siloxanes, where single oxygen bridges are present between the silicon atoms of each unit represented by formulae (I) to (V):

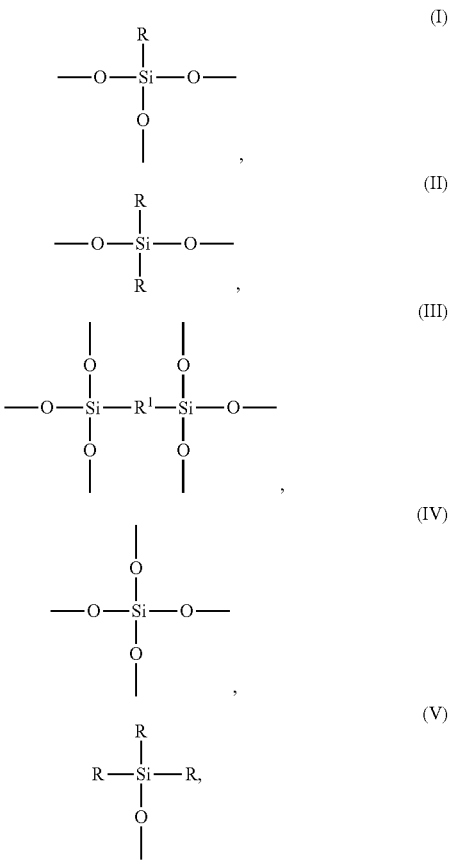

where R and R¹ may each be defined as follows:
R is independently
hydrogen;
linear or branched, substituted or unsubstituted $C_1$-$C_{20}$-alkyl, optionally interrupted by at least one heteroatom, at least partly halogenated;
linear or branched, substituted or unsubstituted $C_1$-$C_{20}$-alkyl, optionally interrupted by at least one heteroatom;
substituted or unsubstituted $C_3$-$C_{20}$-cycloalkyl, optionally attached via a linear or branched $C_1$-$C_{20}$-alkyl chain;
linear or branched, substituted or unsubstituted, at least monounsaturated $C_2$-$C_{20}$-alkenyl, optionally interrupted by at least one heteroatom;
linear or branched, substituted or unsubstituted, at least monounsaturated $C_2$-$C_{20}$-alkynyl, optionally interrupted by at least one heteroatom;

substituted or unsubstituted $C_5$-$C_{30}$-aryl, optionally attached via a linear or branched $C_1$-$C_{20}$-alkyl chain, $R^1$ is a linear or branched $C_1$-$C_{20}$-alkylidene, -alkenylidene or -alkynylidene group, which may optionally be interrupted by functional groups including aromatics or heteroaromatics or heteroatoms including O, S, P or N, or substituted or unsubstituted $C_5$-$C_{30}$-arylene.

* * * * *